(12) United States Patent
Shackleton

(10) Patent No.: US 11,204,549 B2
(45) Date of Patent: Dec. 21, 2021

(54) SUPERSTRATE WITH AN OFFSET MESA AND METHODS OF USING THE SAME

(71) Applicant: CANON KABUSHIKI KAISHA, Tokyo (JP)

(72) Inventor: Steven C. Shackleton, Austin, TX (US)

(73) Assignee: CANON KABUSHIKI KAISHA, Tokyo (JP)

(*) Notice: Subject to any disclaimer, the term of this patent is extended or adjusted under 35 U.S.C. 154(b) by 56 days.

(21) Appl. No.: 16/171,626

(22) Filed: Oct. 26, 2018

(65) Prior Publication Data

US 2020/0133119 A1 Apr. 30, 2020

(51) Int. Cl.
| | |
|---|---|
| *G03F 7/00* | (2006.01) |
| *H01L 21/3105* | (2006.01) |
| *H01L 21/67* | (2006.01) |
| *H01L 23/544* | (2006.01) |
| *H01L 21/68* | (2006.01) |

(52) U.S. Cl.
CPC ...... *G03F 7/0002* (2013.01); *H01L 21/31051* (2013.01); *H01L 21/67092* (2013.01); *H01L 23/544* (2013.01); *H01L 2223/54426* (2013.01)

(58) Field of Classification Search
CPC .............. G03F 7/0002; H01L 23/544; H01L 21/31051
See application file for complete search history.

(56) References Cited

U.S. PATENT DOCUMENTS

| | | | |
|---|---|---|---|
| 6,218,316 B1 | 4/2001 | Marsh | |
| 8,084,185 B2 | 12/2011 | Burns et al. | |
| 2003/0160195 A1* | 8/2003 | Kosugi | H01L 21/681 |
| | | | 250/559.29 |
| 2003/0175531 A1* | 9/2003 | Fournel | C30B 33/06 |
| | | | 428/441 |
| 2006/0141744 A1* | 6/2006 | Best | G03F 7/70633 |
| | | | 438/455 |
| 2007/0037362 A1* | 2/2007 | Bahl | H01L 21/6835 |
| | | | 438/455 |
| 2010/0073656 A1* | 3/2010 | Imaoka | G03F 9/7088 |
| | | | 355/55 |
| 2012/0299222 A1 | 11/2012 | Lan et al. | |
| 2013/0139950 A1* | 6/2013 | Naka | G01B 11/272 |
| | | | 156/64 |
| 2015/0104999 A1* | 4/2015 | Seki | B24B 37/30 |
| | | | 451/28 |
| 2018/0147825 A1* | 5/2018 | Tsao | H01L 21/67092 |

FOREIGN PATENT DOCUMENTS

| | | |
|---|---|---|
| CN | 102096315 A | 6/2011 |
| CN | 102346369 A | 2/2012 |
| WO | 2012083578 A1 | 6/2012 |

* cited by examiner

*Primary Examiner* — Michael Jung
(74) *Attorney, Agent, or Firm* — Abel Schillinger, LLP

(57) ABSTRACT

An apparatus may include a superstrate. The superstrate may have a body with a first side, a second side opposite the first side, and a first diameter. The superstrate may also include a mesa on the first side of the body. The mesa may have a second diameter. The center point of the body can be different from the center point of the mesa.

14 Claims, 5 Drawing Sheets

SUPERSTRATE WITH AN OFFSET MESA AND METHODS OF USING THE SAME

FIELD OF THE DISCLOSURE

The present disclosure relates to substrate processing, and more particularly to planarization of surfaces in semiconductor fabrication.

RELATED ART

Planarization techniques are useful in fabricating electronic devices on semiconductor wafers. Such techniques can include the use of fluid dispense systems for depositing a formable material onto the wafer. A superstrate planarizes and/or patterns the dispensed material before the dispensed material is solidified on the wafer.

However, defects can arise as the superstrate separates from the dispense material on the substrate. Improvements in planarization techniques are desired to allow for whole wafer processing.

SUMMARY

In an aspect, a superstrate can include a body with a first side, a second side opposite the first side, and a first diameter, and a mesa on the first side of the body. The mesa can have a second diameter. The center point of the body can be different from the center point of the mesa.

In another aspect, the second diameter is smaller than the first diameter.

In another aspect, the body further comprises an edge region and the mesa can include an edge region.

In yet another aspect, a first portion of the edge region of the mesa is aligned with a first portion of the edge region of the body.

In another aspect, the superstrate can further include an exclusion region. The exclusion region is an area between an outer edge of the mesa and an outer edge of the body.

In a further aspect, the exclusion region can circumferentially surround the perimeter region of the mesa.

In another aspect, the exclusion region is non-encompassing.

In another aspect, the superstrate can further include at least one alignment marker within the exclusion region.

In another aspect, the exclusion region can include a first zone and a second zone opposite the first zone. The first zone can have a distance Y between the outer edge of the mesa and the outer edge of the body defined by the formula $0 \leq Y \leq 2X$. X can be equal to a radius of the superstrate body minus a radius of the mesa. The second zone of the exclusion region can have a distance Z between the outer edge of the mesa and the outer edge of the body of a value which is defined by $2X-Y$.

In another aspect, $Y \neq Z$.

In another aspect, a planarization apparatus can include a superstrate and a superstrate holder configured to hold the superstrate. The superstrate can include a body having a center point, a first side, a second side opposite the first side, and a first diameter, a mesa on the first side of the body, wherein the mesa has a second diameter and a center point, and an exclusion region between an outer edge of the body and an outer edge of the mesa. The center point of the body can be different from the center point of the mesa.

In another aspect, the exclusion region comprises a first zone and a second zone opposite the first zone.

In another aspect, the first zone can have a distance Y between the outer edge of the mesa and the outer edge of the body defined by the formula $0 \leq Y \leq 2X$. X can be equal to a radius of the superstrate body minus a radius of the mesa, and the second zone of the exclusion region can have a distance Z between the outer edge of the mesa and the outer edge of the body of a value which is defined by $2X-Y$.

In another aspect, the first diameter can be different than the second diameter.

In another aspect, a method of forming a planarization layer can include depositing a formable material on a substrate. The substrate can include a center point. The method can also include aligning a superstrate with the substrate. The superstrate can include a body having a center point, a first side, a second side opposite the first side, and a first diameter, a mesa on the first side of the body, wherein the mesa has a second diameter, a center point, and a planar contact surface, and wherein the center point of the body is different from the center point of the mesa, and an exclusion region. The exclusion region can be an area between an outer edge of the mesa and an outer edge of the body. The method can also include contacting the mesa with the substrate to form a planar layer on the substrate.

In another aspect, the method can also include separating the mesa and the substrate.

In another aspect, separating the mesa and the substrate is by applying a force on the exclusion region.

In another aspect, the superstrate can further include at least one alignment marker to help align the superstrate with the substrate.

In another aspect, the alignment marker can be in the exclusion region.

In another aspect, the first diameter can be different from the second diameter.

BRIEF DESCRIPTION OF THE DRAWINGS

Embodiments are illustrated by way of example and are not limited in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the imprint and lithography arts.

Figure 1:
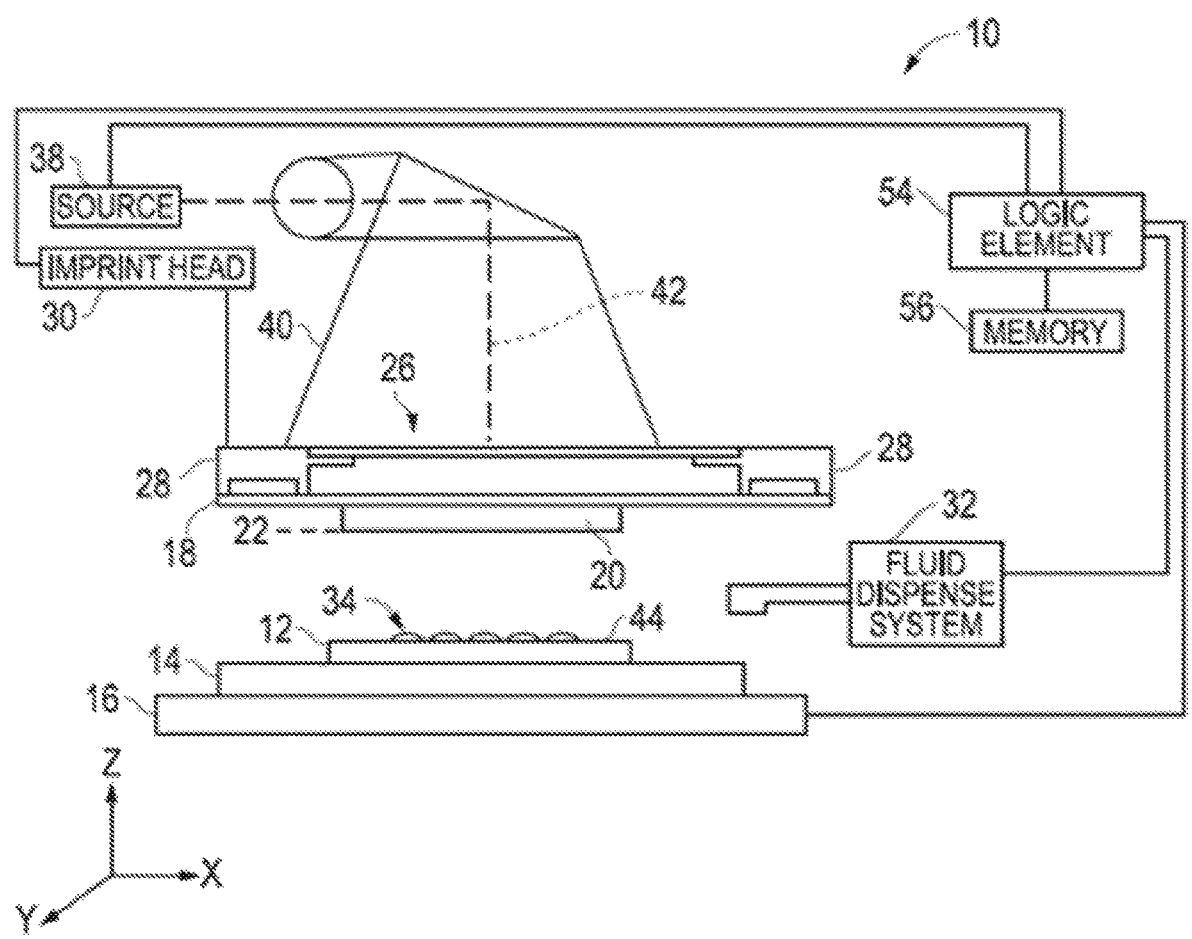
FIG. 1 includes an illustration of a side view of an exemplary lithography system.

Referring to FIG. 1, an apparatus 10 in accordance with an embodiment described herein can be used in controlling the environment over a substrate 12 in preparation for planarization. The substrate 12 may be a semiconductor base material, such as a silicon wafer, but may include an insulating base material, such as glass, sapphire, spinel, or the like. The substrate 12 may be coupled to a substrate holder 14. The substrate holder 14 may be a vacuum chuck; however, in other embodiments the substrate holder 14 may be any chuck including vacuum, pin-type, groove-type, electrostatic, electromagnetic, or the like. The substrate 12 and substrate holder 14 may be further supported by a stage 16. The stage 16 may provide translating or rotational motion along the X-, Y-, or Z-directions. The stage 16, substrate 12, and substrate holder 14 may also be positioned on a base (not illustrated).

Spaced-apart from the substrate 12 may be a superstrate 18. The superstrate 18 can include a body having a first side and a second side with one side having a mold 20 extending therefrom towards the substrate 12. The mold 20 is sometimes referred to as a mesa. In an embodiment, the superstrate 18 can be formed without a mold 20. The superstrate 18, mold 20, or both may be formed from such materials including a glass-based material, silicon, a spinel, fused-silica, quartz, silicon, organic polymers, siloxane polymers, fluorocarbon polymers, metal, hardened sapphire, other similar materials, or any combination thereof. The glass-based material can include soda lime glass, borosilicate glass, alkali-barium silicate glass, aluminosilicate glass, quartz, synthetic fused-silica, or the like. The superstrate 18 can include a deposited oxide, anodized alumina, an organosilane, an organosilicate material, an organic polymer, inorganic polymers, and any combination thereof. The body of the superstrate 18 can have a thickness in a range of 30 microns to 2000 microns.

The superstrate 18 and mold 20 can include a single piece construction. Alternatively, the superstrate 18 and mold 20 can include separate components coupled together. In one embodiment, an imprint surface 22 of the mold 20 can include a planar surface. In another embodiment, the imprint surface 22 can include features defined by spaced-apart recesses and protrusions. The imprint surface 22 may define any original pattern that forms the basis of a pattern to be formed on the substrate 12. In another embodiment, the imprint surface 22 can be a blank, that is, the imprint surface 22 does not have any recesses or projections and can have a planar contact surface.

Among other things, the superstrate 18 can be used to planarize a formable material on a substrate 12. The superstrate 18 can be coupled to a superstrate holder 28. The superstrate 18 may be both held by and its shape modulated by the superstrate holder 28. The superstrate holder 28 may be configured to hold a superstrate 18 within a chucking region. The superstrate holder 28 can be configured as vacuum, pin-type, groove-type, electrostatic, electromagnetic, or another similar holder type. In one embodiment, the superstrate holder 28 can be used to modulate the shape of superstrate 18 by applying pressure, either positive or vacuum, to various zones of holder 28 in order to modulate the shape of the superstrate 18. In one embodiment, the superstrate holder 28 can include a transparent window 26 within the body of the superstrate holder 28. In an embodiment, the superstrate holder 28 may be coupled to an imprint head 30 such that the superstrate holder 28 or imprint head 30 can facilitate translation or rotational motion of the superstrate 18 along the X-, Y-, or Z-directions. In one embodiment, the superstrate 18 can have a surface area that is about the same as the substrate 12. In one embodiment, the substrate 12 and superstrate 18 may have a 300 mm diameter. In one embodiment, the substrate 12 and superstrate 18 may have a diameter between 300 mm and 600 mm. In one embodiment, the substrate 12 and superstrate 18 may have a diameter between 300 mm and 450 mm. In another embodiment, the substrate 12 and superstrate 18 may have a diameter between 450 mm and 600 mm.

The apparatus 10 can further include a fluid dispense system 32 used to deposit a formable material 34 on the surface 44 of the substrate 12. For example, the formable material 34 can include a polymerizable material, such as a resin. The formable material 34 can be positioned on the substrate 12 in one or more layers using techniques such as droplet dispense, spin-coating, dip coating, chemical vapor deposition (CVD), physical vapor deposition (PVD), thin film deposition, thick film deposition, or combinations thereof. The formable material 34 can be dispensed upon the substrate 12 before or after a desired volume is defined between the mold 20 and the substrate 12. For example, the formable material 34 can include a monomer mixture that can be cured using ultraviolet light, heat, or the like.

The lithographic system 10 can further include an energy source 38 coupled to a direct energy 40 along a path 42. The imprint head 30 and stage 16 can be configured to position the template 18 and substrate 12 in superimposition with the path 42. The lithographic system 10 can be regulated by a logic element 54 in communication with the stage 16, imprint head 30, fluid dispense system 32, or source 38, and may operate on a computer readable program, optionally stored in memory 56. The logic element 54 may be a processor (for example, a central processing unit of a microprocessor or microcontroller), a field-programmable gate array (FPGA), an application specific integrated circuit (ASIC), or the like. The processor, FPGA, or ASIC can be within the apparatus. In another embodiment (not illustrated), the logic element can be a computer external to the apparatus 10 and is bidirectionally coupled to the apparatus 10.

Figure 2A:
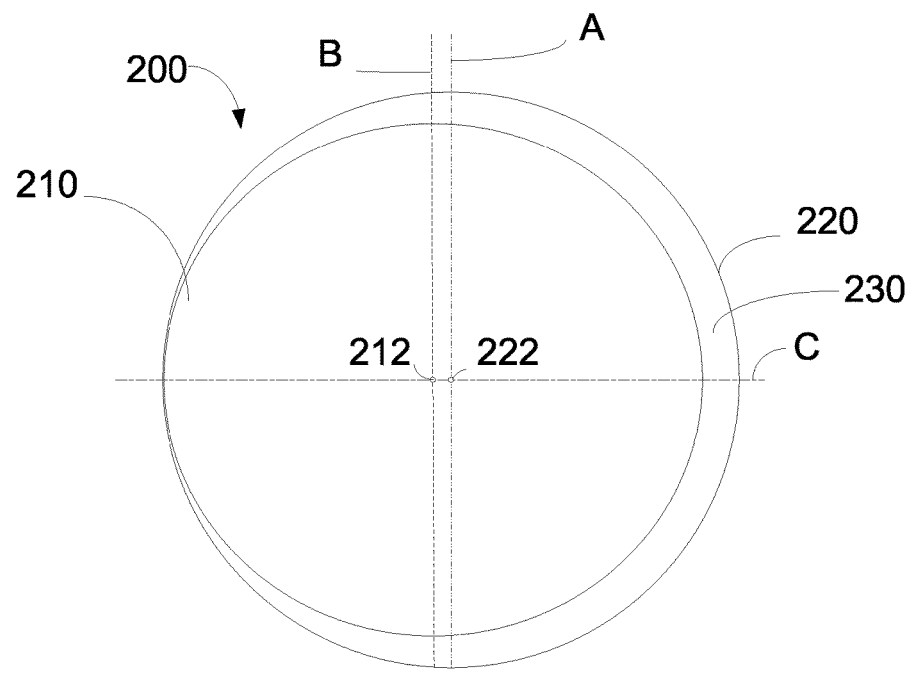
FIG. 2A includes an illustration of a bottom view of a device superstrate in accordance with an embodiment described herein.

FIG. 2A includes an illustration of a bottom view of a device superstrate 200 in accordance with an embodiment described herein. The superstrate 200 can be similar to the superstrate 18 of FIG. 1. The superstrate 200 can include a body 220, a mold 210, and an exclusion region 230. The exclusion region 230 can be the area between the exterior edge of the body 220 and the exterior edge of the mold 210. In one embodiment, the exclusion region 230 can be non-contiguous. In another embodiment, the exclusion region 230 can be a crescent shape. In yet another embodiment, the exclusion region 230 can be a donut shape. In one embodiment, the body 220 has a diameter that can be greater than the diameter of the mold 210. As seen in FIG. 2A, the body 220 can have a central point 222 of its diameter intersected by line A and line C. The mold 210 can have a central point 212 of its diameter intersected by line B and line C. In one embodiment, the central point 222 is different than the central point 212. In other words, the central point 222 is spaced apart from the central point 212. In one embodiment, the mold 210 and the body 220 can share an edge at an area 224. In one embodiment, the exclusion region 230 can be non-encompassing such that the exclusion region 230 does not completely surround the mold 210. In another embodiment, the exclusion region 230 can be crescent shaped. In another embodiment, the exclusion region 230 can be continuous.

The exclusion region 230 can have varying distances as measured at various areas between the exterior edge of the mold 210 and the exterior edge of the body 220. The exclusion region can include a first zone and a second zone opposite the first zone. In one embodiment, the first zone of the exclusion region has a distance Y between the outer edge of the mesa and the outer edge of the body of a value which is greater than or equal to 0 and less than or equal to 2X, where x can be equal to the radius of the superstrate body minus the radius of the mesa; i.e. the first zone can have a distance defined by the formula $0 \leq Y \leq 2X$. The second zone of the exclusion region can have a distance Z between the outer edge of the mesa and the outer edge of the body of a value which is defined by 2X−Y; i.e. Y+Z=2X. In one embodiment, Y≠Z. For example, where the body has a radius of 150 mm and the mesa has a radius of 147 mm, 2X=6, $0 \leq Y \leq 6$, and Z=6−Y. In one embodiment, a first part of the exclusion region 230 can be between 3 mm and 6 mm while a second part of the exclusion region 230 can be between 0 mm and 3 mm. In another embodiment, the first part of the exclusion region 230 can be between 3.5 mm and 6 mm while the second part of the exclusion region 230 can be between 0 mm and 2.5 mm. In another embodiment, the first part of the exclusion region 230 can be between 4 mm and 6 mm while the second part of the exclusion region 230 can be between 0 mm and 2 mm. In another embodiment, the first part of the exclusion region 230 can be between 4.5 mm and 6 mm while the second part of the exclusion region 230 can be between 0 mm and 1.5 mm. The second part of the exclusion region can be at most 2.9 mm, such as 2.5 mm, or at most 2 mm, or at most 1.5 mm, or at most 1 mm, or at most 0.5 mm, or at most 0.1 mm, or at most 0 mm. The first part of the exclusion region can be at most 6 mm, such as 5.5 mm, or at most 5 mm, or at most 4.5 mm, or at most 4 mm, or at most 3.5 mm, or at most 3.1 mm.

Figure 2B:
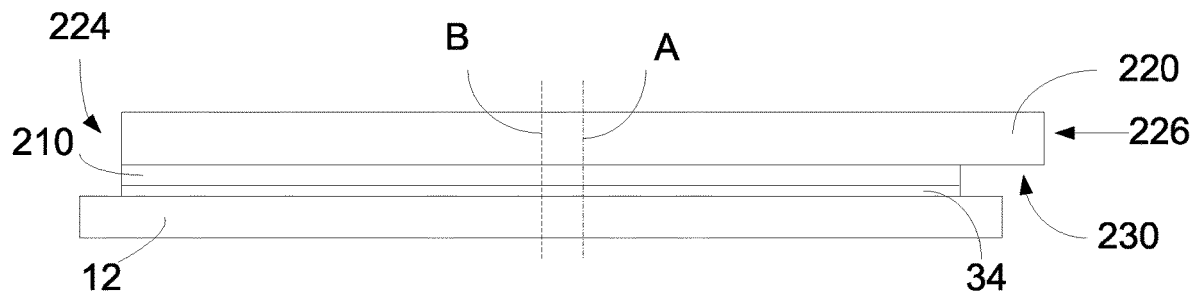
FIG. 2B includes an illustration of a side view of the substrate and the superstrate cut along line C of FIG. 2.

FIG. 2B includes an illustration of a side view of the substrate 12 and the superstrate 200 cut along line C of FIG. 2 after dispensing a planarization precursor material 34. The mold 210 can be between the body 220 and the substrate 12. The body 220 can have a central axis intersected by line A and the mold 210 can have a central axis intersected by line B. In one embodiment, the substrate 12 can have a central axis intersected by line B. In another embodiment, the substrate 12 can have a central axis intersected by line A. In yet another embodiment, the substrate 12 can have a central axis not intersected by either line A or line B. As can be seen in FIG. 2B, the body 220 can have the same diameter as the substrate 12. In one embodiment, the superstrate 200 can have an edge region 224 that is closer to the central axis of the substrate 12 and an opposite edge region 226 that is farther away from the central axis of the substrate 12. In one embodiment, the body 220 is offset from the substrate 12 such that the edge 224 in on the substrate 12 while the edge 226 extends beyond the edge of the substrate 12. In one embodiment, the body 220 can have a diameter about equal to the diameter of the substrate 12. In one embodiment, the mold 210 can have a diameter less than the diameter of the substrate 12. In one embodiment, the exclusion region 230 provides an area in which the superstrate 200 can be leveraged to begin separation from the substrate 12.

Figure 3:
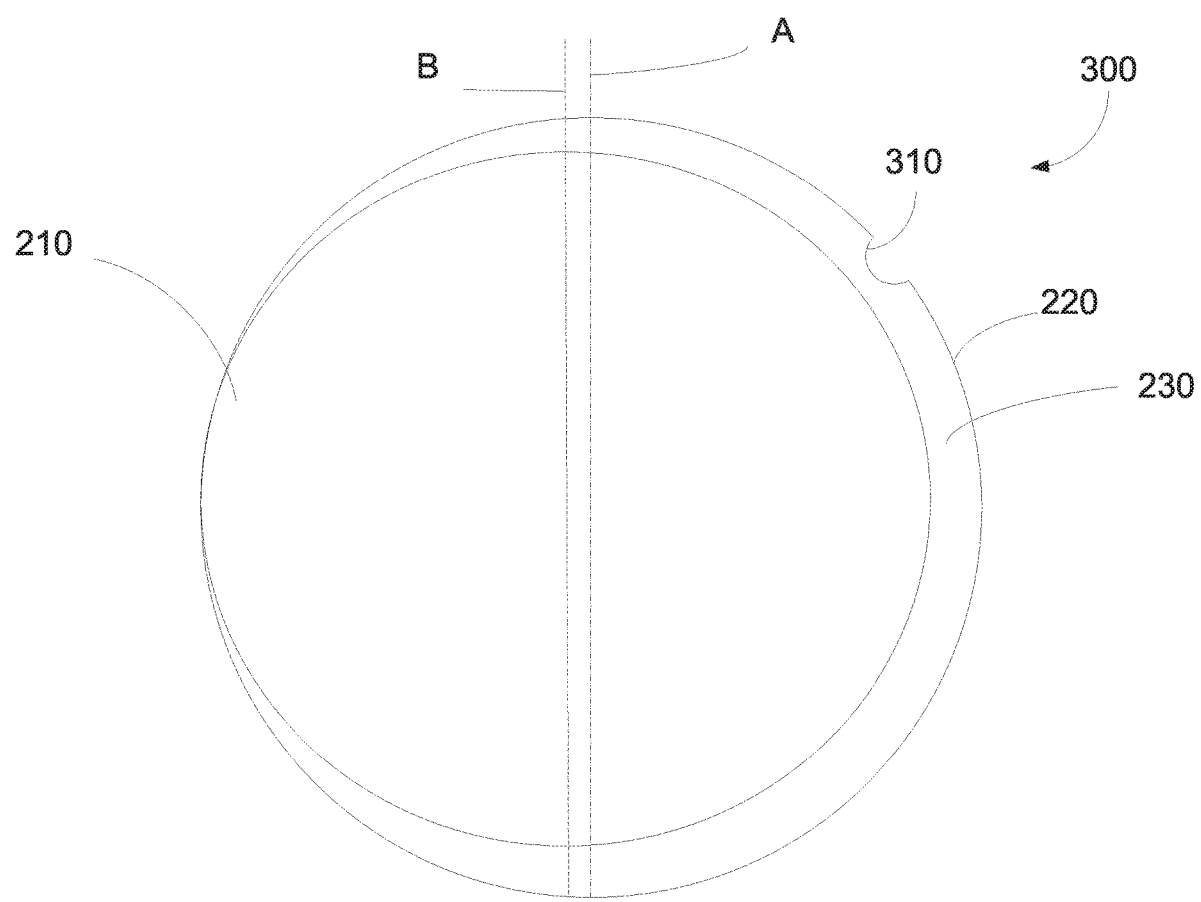
FIG. 3 includes an illustration of a bottom view of a device superstrate in accordance with an embodiment described herein.

FIG. 3 includes an illustration of a bottom view of a device superstrate 300 in accordance with an embodiment described herein. The superstrate 300 can be similar to the superstrate 18 of FIG. 1. The superstrate 300 can include the body 220, the mold 210, the exclusion region 230, and at least one alignment marker 310. The alignment marker 310 can be a notch (as seen in FIG. 3), a bump, an etched relief, a laser marking, an etched or marked protrusion, or another protrusion. The alignment marker 310 can be circular, semicircular, rectangular, hexagonal, triangular, or any other geometric shape. The alignment marker 310 can be in the exclusion region 230. In one embodiment, the superstrate 300 can include one or more alignment markers 310. In one embodiment, the alignment markers 310 can be of varying shapes or combinations. For example, in one embodiment, a first alignment marker may be a protrusion and a second alignment marker can be a notch. The alignment marker 310 can provide a guide in the system 10 to align the central axis of the mold 210 with the central axis of the substrate 12 during processing. Additionally, the alignment marker 310 can provide an orientation marker for further substrate analysis. In one embodiment, the alignment marker 310 can be located opposite the edge 224. In one embodiment, the alignment marker 310 can extend into the exclusion region 230. In one embodiment, the alignment marker 310 can be within the exclusion region 230.

Figure 4:
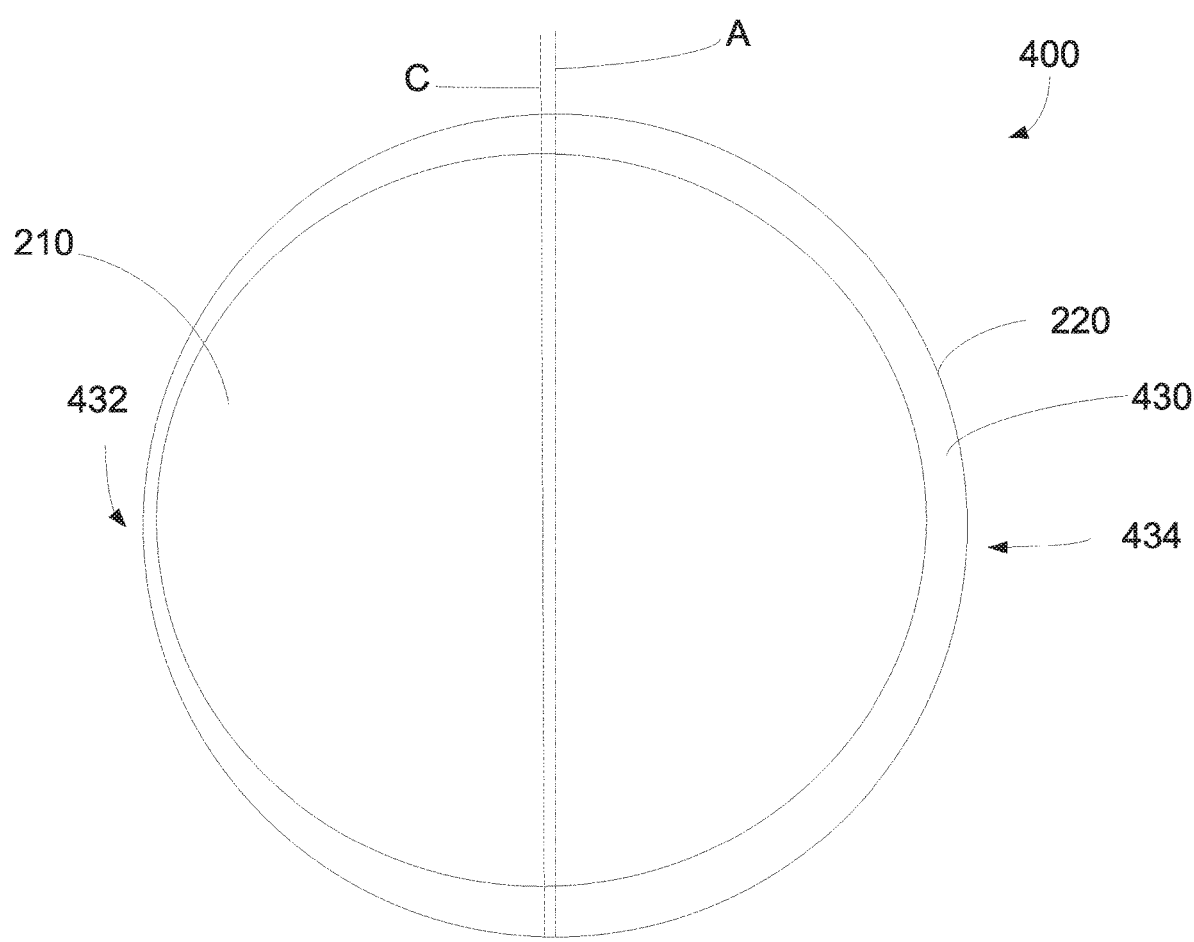
FIG. 4 includes an illustration of a bottom view of a device superstrate in accordance with an embodiment described herein.

FIG. 4 includes an illustration of a bottom view of a device superstrate 400 in accordance with an embodiment described herein. The superstrate 400 can be similar to the superstrate 18 of FIG. 1. The superstrate 400 can include the body 220, the mold 210, and the exclusion region 430. In one embodiment, the superstrate can include an alignment marker similar to the alignment marker 310. The exclusion region 430 can be the region measured between the outer edge of the superstrate 400 and the outer edge of the mold 210. The exclusion region 430 can circumferentially surround the mold 210. In one embodiment, the exclusion region 430 is non-uniform as it surrounds the mold 210. In other words, the outer edge of the superstrate 400 can be closer to the outer edge of the mold 210 in a first area 432 and farther apart in a second area 434.

The exclusion region 430 can have varying distances as measured at various areas between the exterior edge of the mold 210 and the exterior edge of the body 220. The exclusion region can include a first area 434 and a second area 434 opposite the first area 434. In one embodiment, the first area 434 of the exclusion region 430 has a distance Y between the outer edge of the mesa and the outer edge of the body of a value which is greater than or equal to 0 and less than or equal to 2X, where x can be equal to the radius of the superstrate body minus the radius of the mesa; i.e. the first area 434 can have a distance defined by the formula $0 \leq Y \leq 2X$. The second area 432 of the exclusion region 430 can have a distance Z between the outer edge of the mesa and the outer edge of the body of a value which is defined by 2X−Y; i.e. Y+Z=2X. In one embodiment, Y≠Z. For example, where the body has a radius of 150 mm and the mesa has a radius of 147 mm, 2X=6, $0 \leq Y \leq 6$, and Z=6−Y. In one embodiment, the first area 434 of the exclusion region 430 can be between 3.5 mm and 5.5 mm while the second area 432 of the exclusion region 230 can be between 0.5 mm and 2.5 mm.

As seen in FIG. 4, the body 220 can have a central point of its diameter intersected by line A. The mold 210 can have a central point of its diameter intersected by line C. In one embodiment, the central point of the body 220 is different than the central point of the mold 210. In one embodiment, the central point of the body 220 can be spaced apart the central point of the mold 210 by at most 3 mm, such as 2.5 mm, or at most 2 mm, or 1.5 mm, or 0.5 mm.

Figure 5:
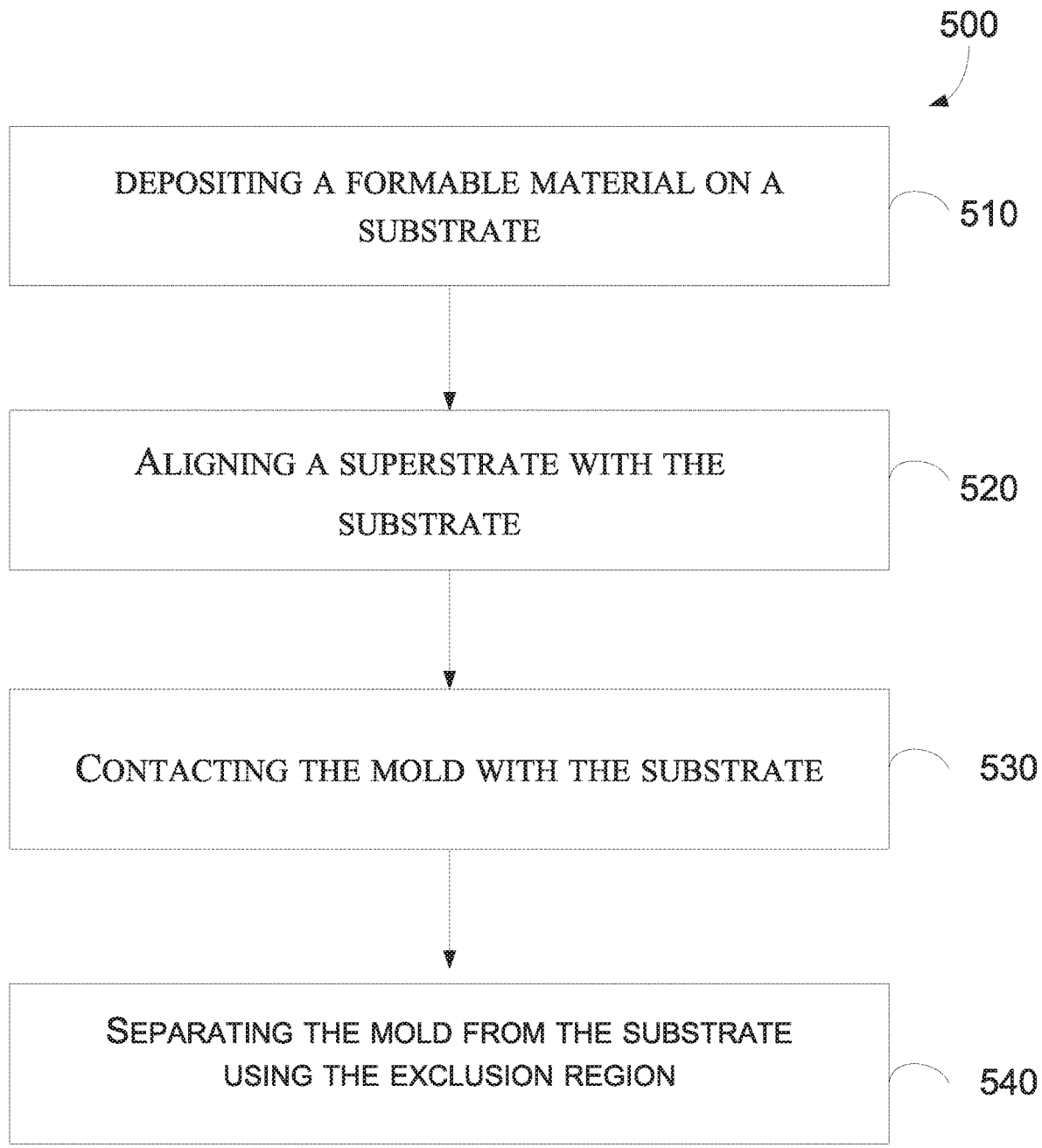
FIG. 5 includes an illustration of a method of the present disclosure.

FIG. 5 includes an illustration of a method 500 of the present disclosure. The method 500 can be performed in the apparatus 10. At operation 510, the formable material 34 can be deposited on the substrate 12. The formable material 34 can be deposited using the fluid dispense system 32. At operation 520, the superstrate 18 can be aligned with the substrate 12. The superstrate 18 can be aligned using an alignment marker, such as alignment marker 310 described above. The superstrate 18 is aligned with the substrate 12 such that the central axis of the mold 210 can be about the same as the central axis of the substrate 12. At operation 530, the mold 210 can contact the formable material 34 on the substrate 12. The imprint head 30 can lower the superstrate 18 towards the substrate 12 until the mold 210 contacts the formable material 34 deposited on the substrate 12. The superstrate 18 can spread and fill the space between the superstrate 18 and the mold 210. The formable material 34 may be cured (e.g., photocuring or thermally) to form a planarization layer. After the planarization layer is formed, the mold 210 may be separated from the substrate 12 using the exclusion region 230, at operation 540. By aligning the superstrate 18, mold 230, and substrate 12 as described above, the superstrate 18 can have an overhang area or a part of the exclusion region 230 that extends beyond the outer edge of the substrate 12. As such, an applied force, either mechanical, vacuum, or fluid pressure, can be applied to the exclusion region 230 to initiate separation between the superstrate 18 and the substrate 12. In one embodiment, a piezo actuator can be used to contact and push on the exclusion region 230 to enhance peeling a crack propagation between the superstrate 18 and substrate 12. In another embodiment, fluid pressure can be used to push up on the exclusion region 230 and initiate crack propagation. In yet another embodiment, an actuator can lift or pull on the superstrate 18 with in the exclusion region 230. By biasing the mold 230 on the superstrate 18 such the central axis of the superstrate 18 is different from the central axis of the mold 230, an exclusion region can be created that can be used to separate the superstrate 18 from the substrate 12 during operation. In other words, by biasing the mold 230 on a superstrate that is substantially the same size as the substrate, the superstrate can be used to initiate separation with the substrate during whole substrate processing thereby saving manufacturing costs related to equipment designed specifically for superstrates that are of different sizes than the substrate.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A superstrate for forming a planarization layer by curing a formable material disposed on a substrate, the superstrate comprising:
   a body of the superstrate having a first diameter, a first side, and a second side opposite the first side; and
   a mesa on the first side of the body, wherein the mesa has a second diameter, wherein a center point of the first diameter of the body is different from a center point of the second diameter of the mesa, wherein the mesa of the superstrate and the formable material on the substrate are in contact with each other while curing the formable material, and wherein the center point of the first diameter of the body is spaced apart from the center point of the second diameter of the mesa by at most 3 mm.

2. The superstrate of claim 1, wherein the second diameter is smaller than the first diameter.

3. The superstrate of claim 1, wherein the body further comprises an edge region and wherein the mesa further comprises an edge region.

4. The superstrate of claim 3, wherein a first portion of the edge region of the mesa is aligned with a first portion of the edge region of the body.

5. The superstrate of claim 1, further comprising an exclusion region, wherein the exclusion region is an area between an outer edge of the mesa and an outer edge of the body.

6. The superstrate of claim 5, wherein the exclusion region circumferentially surrounds the perimeter region of the mesa.

7. The superstrate of claim 5, wherein the exclusion region is noncontiguous.

8. The superstrate of claim 5, further comprising at least one alignment marker within the exclusion region.

9. The superstrate of claim 5, wherein the exclusion region comprises a first zone and a second zone opposite the first zone, wherein the first zone has a distance Y between the outer edge of the mesa and the outer edge of the body defined by the formula $0 \leq Y \leq 2X$, wherein X is equal to a radius of the superstrate body minus a radius of the mesa, and wherein the second zone of the exclusion region has a distance Z between the outer edge of the mesa and the outer edge of the body of a value which is defined by $2X-Y$.

10. The superstrate of claim 9, wherein Y≠Z.

11. The superstrate of claim 5, wherein the exclusion region is large enough to allow a pin to press to separate the superstrate from the formable material on the substrate.

12. The superstrate of claim 1, wherein the superstrate has a thickness in a range of 30 microns to 2000 microns.

13. The superstrate of claim 1, wherein the second diameter is at least 50% of the first diameter.

14. A superstrate for forming a planarization layer by curing a formable material disposed on a substrate, the superstrate comprising:
- a body of the superstrate having a first diameter, a first side, and a second side opposite the first side, wherein the body comprises a material selected from the group consisting of a glass-based material, spinel, fused-silica, silicon, quartz, organic polymers, siloxane polymers, fluorocarbon polymers, metal, hardened sapphire, and a combination thereof; and
- a mesa on the first side of the body, wherein the mesa has a second diameter, wherein a center point of the first diameter of the body is different from a center point of the second diameter of the mesa, wherein the mesa of the superstrate and the formable material on the substrate are in contact with each other while curing the formable material, and wherein the mesa comprises a material selected from the group consisting of a glass-based material, spinel, fused-silica, silicon, quartz, organic polymers, siloxane polymers, fluorocarbon polymers, metal, hardened sapphire, and a combination thereof.

* * * * *